(12) United States Patent
Jun

(10) Patent No.: US 6,678,010 B2
(45) Date of Patent: Jan. 13, 2004

(54) METHOD AND APPARATUS FOR GENERATING AUTO GAIN CONTROL SIGNAL HAVING INFORMATION STORING FEATURE

(75) Inventor: Jung Sig Jun, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 399 days.

(21) Appl. No.: 09/768,257

(22) Filed: Jan. 25, 2001

(65) Prior Publication Data

US 2001/0010563 A1 Aug. 2, 2001

(30) Foreign Application Priority Data

Jan. 27, 2000 (KR) .......................................... 2000-4017

(51) Int. Cl.$^7$ ................................................ H04N 5/52
(52) U.S. Cl. ...................................... 348/678; 375/345
(58) Field of Search ................................ 348/678, 725, 348/470, 707; 375/311, 345; 455/232.1, 234.1, 239.1, 240.1; 341/139

(56) References Cited

U.S. PATENT DOCUMENTS

| | | | | | |
|---|---|---|---|---|---|
| 4,785,352 | A | * | 11/1988 | Burrowes et al. | ............ 358/174 |
| 5,566,214 | A | * | 10/1996 | Kroeger et al. | ............. 375/355 |
| 5,764,309 | A | * | 6/1998 | Krishnamurthy et al. | ... 348/678 |
| 5,841,820 | A | * | 11/1998 | Krishnamurthy et al. | ... 375/345 |
| 6,088,583 | A | * | 7/2000 | Shimizu et al. | .......... 455/235.1 |
| 6,122,331 | A | * | 9/2000 | Dumas | ........................ 375/345 |

* cited by examiner

Primary Examiner—Victor R. Kostak
(74) Attorney, Agent, or Firm—Birch, Stewart, Kolasch & Birch, LLP

(57) ABSTRACT

The present invention discloses a device and method for generating an auto gain control signal. When a gain of an input signal is very different from a wanted gain, an increase of an integral value is prevented by repeatedly resetting an integrator. Especially, the device can sensitively respond to a fast moving substance on a channel, by reducing a repeated reset period of the integrator. At the same time, it is possible to minimize reduction of the performance of a receiver due to a residual jitter generated by the shortened period. As a result, the receiver has an improved performance in regard to the gain variations of the whole channels.

14 Claims, 4 Drawing Sheets

METHOD AND APPARATUS FOR GENERATING AUTO GAIN CONTROL SIGNAL HAVING INFORMATION STORING FEATURE

BACKGROUND OF THE INVENTION

1. Field of the Invention

The present invention relates to a device and method for generating an auto gain control (AGC) signal in a digital TV receiver using a vestigial sideband (VSB) method.

2. Description of the Related Art

A digital TV makes users feel as if they were in theaters. That is, as compared with a general analog TV, the digital TV has a high resolution (for example, 1080×1920) and a wide screen in a lateral direction (16:9, to maximally apply an aspect ratio of movies such as 4:3, 5:3, 1.85:1, 2.4:1, etc.), and provides a CD level sound through a multi channel (maximally 5.1 channel).

The countries worldwide including the USA, Europe and Japan have been standardizing the digital TV by preparing their own broadcasting methods and standards. For example, the USA has introduced a vestigial sideband (VSB) method suggested by Zenith as a transmission format, an MPEG as a video compression format, a Dolby AC-3 as an audio compression format, and a display method compatible with a general display method as a display format.

On the other hand, a gain magnitude of a signal from a transmitter is constant, but may be varied by a distance from the transmitter to the receiver and various kinds of channels. Accordingly, the signal with a varied gain is inputted to the receiver. However, most of the digital sections of the receiver are designed, presuming that the signal having a constant gain is inputted. Therefore, it is required to convert an analog signal inputted to the receiver into a digital signal, after controlling a gain of the analog signal to have a constant magnitude. Here, a signal level of a transmission terminal may be smaller or greater than a signal level of a reception terminal according to a transmission or reception power, and thus it is necessary to control the gain.

The gain control operation is performed by an auto gain control (AGC) device. The AGC device judges a gain of the current input signal on the basis of an average or power of the input signals. Thereafter, the AGC device controls an analog amplifier between an RF terminal and an IF terminal according to the resultant gain, so that the signal can have a wanted magnitude.

A delayed AGC method as shown in FIG. 1 has been widely employed as a transmission method.

Firstly, when a VSB modulated RF signal is inputted through an antenna 101, a tuner 102 selects a frequency of a wanted channel by tuning, and converts the frequency into an IF signal. A demodulator 103 is used to exactly restore a base band signal from the IF signal.

The analog base band signal restored in the demodulator 103 is inputted to an A/D converter 104. The A/D converter 104 converts the analog signal into a digital signal, and outputs the digital signal to a digital processor 105 and an AGC signal generator 106. In addition, the demodulator 103 increases or decreases the gain according to gain control signals GainUp, GainDn fed back from the AGC signal generator 106.

The digital processor 105 equalizes the digital signal from the A/D converter 104 in order to correct linear distortion of an amplitude causing interference between symbols and ghost generated due to reflection to buildings or mountains. Thereafter, the digital processor 105 corrects errors of the digital signal generated through a transmission channel, and outputs the digital signal to a video decoder 107. The video decoder 107 decodes the error-corrected signal by the MPEG algorithm, converts the decoded signal into a visible signal, and outputs it to a display device 108.

On the other hand, the AGC signal generator 106 judges the gain magnitude of the currently inputted digital signal, and feeds back the gain up control signal GainUp for increasing the gain of the input signal or the gain down control signal GainDn for decreasing the gain of the input signal to the demodulator 103, thereby adjusting the gain of the analog signal inputted to the A/D converter 104 to have a wanted magnitude. In order to control the actual gain, the receiver is set to have a maximum gain in a power on or channel change operation, and the demodulator 103 firstly controls the gain according to the gain magnitude of the input signal.

When the demodulator 103 is not able to control the gain, if an output signal from the A/D converter 104 does not have a wanted magnitude, the demodulator 103 transmits the delayed AGC signal to the tuner 102, controls the gain of the tuner 102, and thus constantly maintains the gain of the input signal.

Here, the AGC signal generator 106 which is the most important unit of the AGC device judges whether to increase or decrease the gain of the input signal.

FIG. 2 is a detailed block diagram illustrating a conventional AGC signal generator. The AGC signal generator judges the gain of the input signal on the basis of an average of the input signals to an absolute value, and generates the gain up/down signal GainUp/Dn to control the gain of the input signal.

That is, an absolute value calculator 201 calculates an absolute value of the inputted digital signal, and transmits the absolute value to an integrator 202. So as to compute an average of the output signals from the absolute value calculator 201, the integrator 202 performs integration in predetermined units, and outputs a resultant value to an average calculator 203. At this time, the absolute value of the input signal is calculated, instead of squaring the input signal. As a result, the output bit from the absolute value calculator 201 is reduced more than the input bit by one bit.

The average calculator 203 calculates the average of the input signals to the absolute value according to the output from the integrator 202, and generates the gain control signal GainUp/Dn to adjust the average to a wanted value. The gain control signal GainUp/Dn is transmitted to the demodulator 103, and controls the gain magnitude of the signal inputted to the A/D converter 104.

FIG. 3 is a detailed block diagram illustrating the integrator 202. A subtracter 301 outputs a difference between the input signal and a presumed average. An adder 302 adds the difference signal to an output from a buffer 303, outputs the resultant value to the average calculator 203, and feeds back it to the buffer 303. Here, the receiver is designed, presuming that the gain magnitude of the input signal is always constant. Accordingly, the receiver can presume the average by the gain magnitude.

At this time, the buffer 303 is reset once in an initial stage of the operation. An integral value for the gain is increased to infinity by repeated integration. It is thus impossible to embody the integrator 202 as an actual hardware.

Therefore, the subtracter 301 is positioned before the adder 302 to subtract a wanted average from the input signal, and then the integration is performed, thereby remarkably reducing the integral value. Accordingly, it considerably reduces a load in hardware constitution of the integrator 202.

However, in the case of the integrator shown in FIG. 3, the buffer 303 is reset once in the initial stage of the operation, and thus the integral value is increased when the gain of the input signal is very different from the wanted gain.

SUMMARY OF THE INVENTION

The present invention is proposed to solve the foregoing problems, and it is therefore an object of the invention to provide a device and method for generating an auto gain control (AGC) signal which can obtain a signal having a constant magnitude, by repeatedly resetting an integrator.

Another object of the present invention is to provide a device and method for generating an AGC signal which can facilitate reception of the AGC signal when a fast moving substance exists on a channel, by improving a speed of the AGC signal.

In order to achieve the above-described objects of the present invention, there is provided a device for generating an AGC signal, including: an A/D converter for converting an inputted analog signal into a digital signal; an integrator for calculating an absolute value of the output from the A/D converter, subtracting a predetermined average from the absolute value, adding the resultant value to a preceding integral value, and being reset at predetermined intervals; a frequency divider for calculating an average of the output from the integrator, and removing a predetermined number of low bits proportional to the integral time; an up/down signal generator for generating an up/down signal for controlling a gain according to the output from the frequency divider; and a gain converter for storing information used to control the gain from the initial stage of the system operation, adding the information to the information of the up/down signal from the up/down signal generator, and controlling a gain of the analog signal inputted to the A/D converter.

The integrator includes: an absolute value calculator for calculating an absolute value of the inputted digital signal; a subtracter for subtracting a predetermined average from the absolute value; an adder for adding the output from the subtracter to a preceding integral value; a first storing unit repeatedly reset according to a repeated reset signal, for storing the output from the adder, and feeding back the stored value to the adder as the preceding integral value; and a second storing unit enabled according to the repeated reset signal, for storing a value from the adder just before the first storing unit is reset.

The up/down signal generator converts the output from the frequency divider into sign and magnitude information, decides a gain control direction according to the sign information, squares the magnitude information, and decides a gain control amount according to the squared magnitude information.

In addition, there is provided a device for generating an AGC signal, including: an A/D converter for converting an inputted analog signal into a digital signal; an integrator for calculating an absolute value of the output from the A/D converter, subtracting a predetermined average from the absolute value, adding the resultant value to a preceding integral value, and being reset at predetermined intervals; a frequency divider for calculating an average of the output from the integrator, and removing a predetermined number of low bits proportional to the integral time; a conversion and square unit for obtaining sign and magnitude of the signal from the frequency divider, and squaring the magnitude; an up/down signal generator for generating an up/down signal for controlling a gain according to the sign and squared magnitude information from the conversion and square unit; and a gain converter for storing information used to control the gain from the initial stage of the system operation, adding the information to the information of the up/down signal from the up/down signal generator, and controlling a gain of the analog signal inputted to the A/D converter.

The period of the repeated reset signal inputted to the integrator is shortened.

There is also provided a method for generating an AGC signal, including the steps of: (a) converting an inputted analog signal into a digital signal; (b) resetting at predetermined intervals, calculating an absolute value of the output of step (a), subtracting a predetermined average from the absolute value, and adding the resultant value to a preceding integral value; (c) calculating an average from the output of step (b), and removing a predetermined number of low bits proportional to an integral time; (d) generating an up/down signal for controlling a gain according to the output of step (c); and (e) storing information used to control the gain from the initial stage of the system operation, adding the information to the information of the up/down signal from step (d), and controlling a gain of the analog signal inputted to step (a).

The present invention aims to rapidly respond to gain variations on the channel, without reducing performance of the receiver.

DETAILED DESCRIPTION OF THE PREFERRED EMBODIMENT

A device and method for generating an auto gain control (AGC) signal in accordance with preferred embodiments of the present invention will now be described in detail with reference to the accompanying drawings.

According to the present invention, when a gain of an input signal is very different from a wanted gain of a receiver, an integrator is repeatedly reset to prevent an increase of an integral value.

Figure 4:
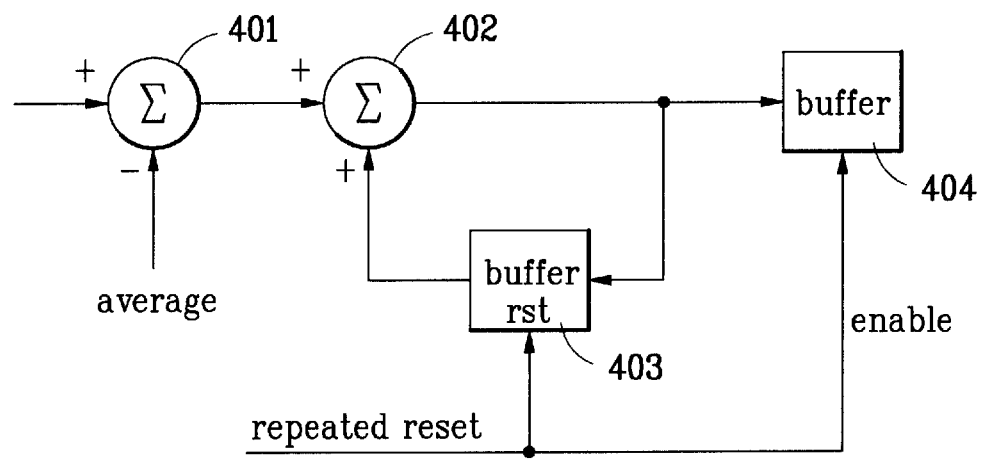
FIG. 4 is a detailed block diagram illustrating an integrator in accordance with the present invention.

FIG. 4 is a detailed block diagram illustrating the integrator in accordance with the present invention. The integrator includes: a subtracter 401 for subtracting a presumed average from the input signal; an adder 402 for adding the output from the subtracter 401 to a preceding integral value; a buffer 403 repeatedly reset according to a repeated reset signal, for storing the output from the adder 402; and a buffer 404 enabled according to the repeated reset signal, for storing a value from the adder 402 just before the buffer 403 is reset. The detailed operation of the integrator will be described later.

Instead of performing the integration to infinity, the buffer 403 storing the integral value is repeatedly reset according to the repeated reset signal to remove the integral value and re-perform the integration. Therefore, it is possible to constitute the integrator as a hardware. As shown in FIG. 4, when the integral value is periodically reset, the buffer 404 for storing the integral value just before the reset operation is additionally required.

The device for generating the AGC signal by using the integrator will now be described in accordance with the first and second embodiments of the present invention.

First Embodiment

Figure 5:
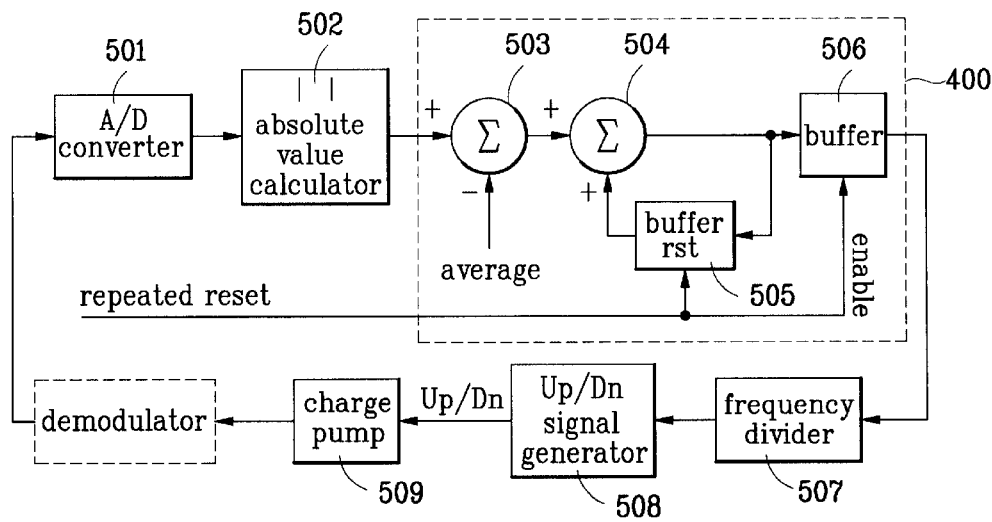
FIG. 5 is a block diagram illustrating a device for generating an AGC signal by using the integrator in FIG. 4 in accordance with a first embodiment of the present invention.

FIG. 5 is a block diagram illustrating the device for generating the AGC signal by using the integrator in FIG. 4 in accordance with the first embodiment of the present invention. The device for generating the AGC signal includes: an A/D converter 501 for converting an analog signal into a digital signal; an absolute value calculator 502 for calculating an absolute value of the output from the A/D converter 501; an integrator 400 for subtracting a predetermined average from the output from the absolute value calculator 502, and adding a preceding integral value to a current input value at predetermined intervals; a frequency divider 507 for calculating an average of the output from the integrator 400, and removing a predetermined number of low bits proportional to the integral time; an up/down signal generator 508 for generating an up/down signal for controlling a gain according to the output from the frequency divider 507; and a gain converter for storing information used to control the gain from the initial stage of the system operation, adding the information to the information of the up/down signal from the up/down signal generator 508, and controlling a gain of a demodulator 103. An example of the gain converter includes a charge pump.

Referring to FIG. 5, the A/D converter 501 converts an analog base band signal demodulated in the demodulator 103 into a digital signal, and outputs the digital signal to the absolute value calculator 502. The absolute value calculator 502 calculates an absolute value of the output from the A/D converter 501, and outputs the absolute value to the subtracter 503 of the integrator 400.

The subtracter 503 removes a wanted average from the absolute value of the input signal, and outputs the resultant value to the adder 504. The adder 504 adds a preceding integral value to a current input value.

Here, the added value is stored in a buffer 505 to be added to a succeeding signal. When the buffer 505 is reset according to a repeated reset signal, a buffer 506 is enabled according to the repeated reset signal, for storing the output from the adder 504.

The output from the buffer 506 is outputted to the frequency divider 507. The frequency divider 507 calculates an average of the output from the buffer 506, and removes a predetermined number of low bits proportional to the integral time in order to prevent influences of an instantaneous value of the input signal.

Here, the presumed average is subtracted from the input signal from an analog terminal, and an average of the input signals is the output from the frequency divider 507. Accordingly, when the gain of the input signal has a wanted value, the output from the frequency divider 507 becomes '0'.

However, when the gain of the input signal is smaller or greater than the wanted value, the output from the frequency divider 507 has a different value. The resultant value is the information for the gain of the input signal.

The information for the gain is outputted to the up/down signal generator 507. According to the information, the up/down signal generator 508 generates an up/down signal for increasing or decreasing the gain of the signal inputted from the analog terminal.

At this time, the integrator 400 is periodically reset according to the repeated reset signal to reduce a size of the hardware. Therefore, the up/down signal from the up/down signal generator 508 is the gain control information of a specific period.

Figure 1:
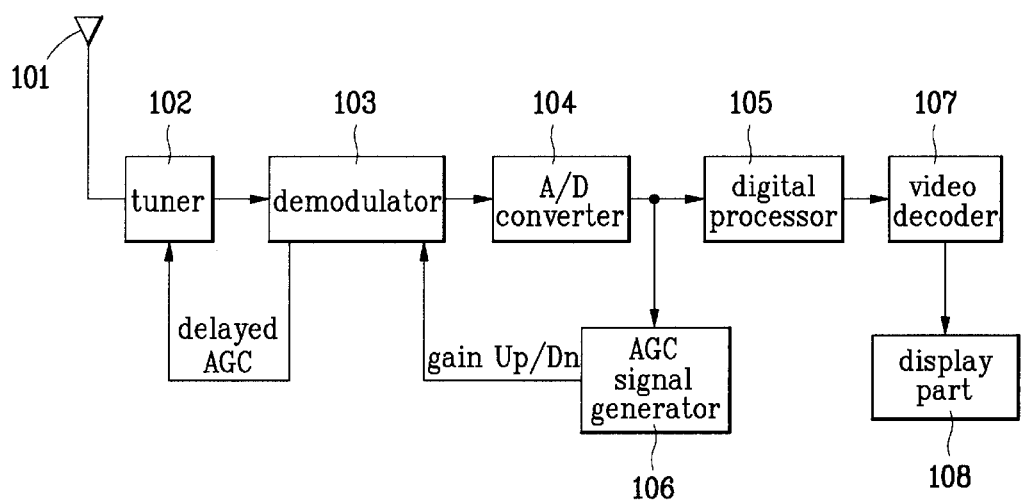
FIG. 1 is a block diagram illustrating a general digital TV receiver having an AGC function.
Figure 2:
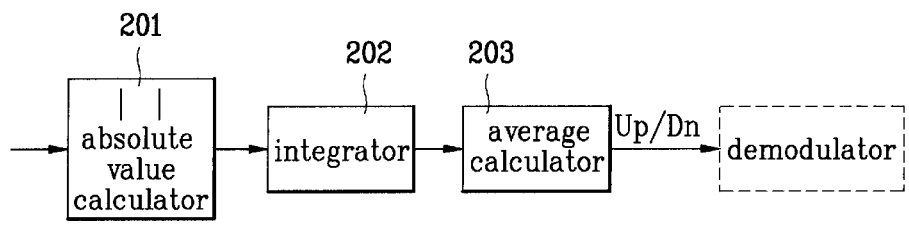
FIG. 2 is a detailed block diagram illustrating an AGC signal generator in FIG. 1.
Figure 3:
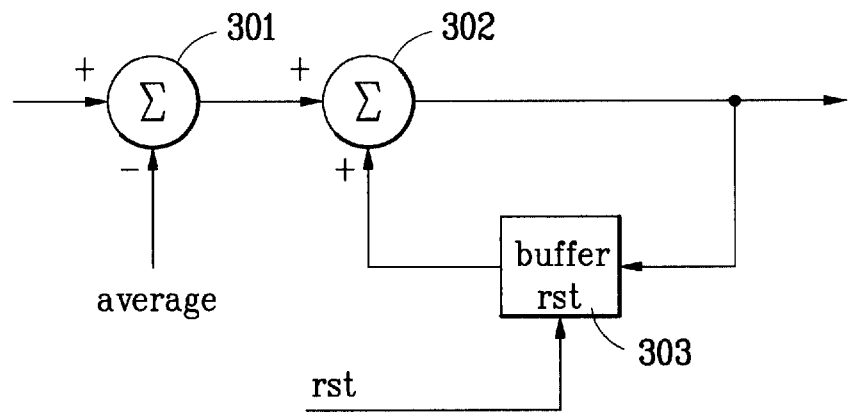
FIG. 3 is a detailed block diagram illustrating an integrator in FIG. 2.

Accordingly, it is necessary to store the information used to control the gain from the initial stage of the system operation. The gain converter 509 serves to store the information. That is, the gain converter 509 adds the information for the currently-inputted up/down signal to the information which has been used to control the gain, thereby controlling the gain of the whole system. The output from the gain converter 509 is inputted to the demodulator 103 shown in FIG. 1 to control the gain of the analog signal.

The period of the repeated reset signal for resetting the integrator 400 in FIG. 5 may be varied. When the reset period is increased, the inputted signals are integrated for an extended period of time, and thus precise information for the gain can be obtained. Conversely, when the reset period is decreased, it is possible to sensitively respond to variations of the gain of the input signal.

In addition, when the reset period is increased, an increased number of low bits must be removed after integration. However, when the reset period is decreased, a relatively small number of low bits are removed. In this case, the instantaneous value of the input signal and noise in the input signal have much influenced, thereby increasing a residual jitter after convergence of the device. Accordingly, when the reset period is shortened, the device can sensitively respond to variations of the gain of the input signal, and thus very advantageous when a fast moving substance such as airplanes exist on a channel. However, since the residual jitter is increased, a magnitude variation of the analog signal inputted to the A/D converter 501 is also increased on a channel having little gain variations. As a result, performance of the receiver is deteriorated.

Second Embodiment

Figure 6:
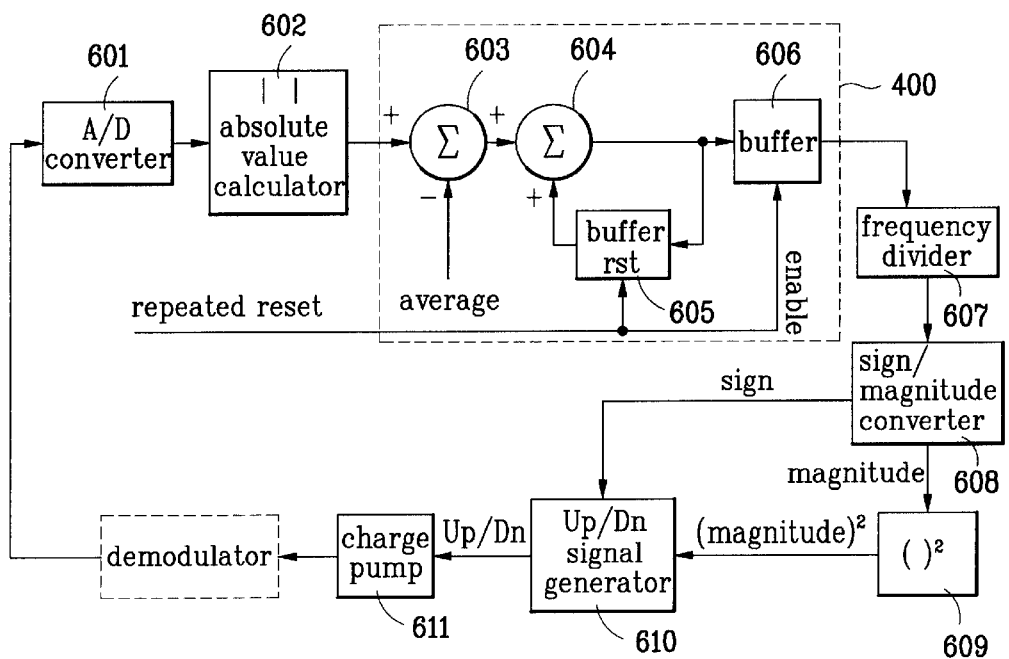
FIG. 6 is a block diagram illustrating a device for generating an AGC signal by using the integrator in FIG. 4 in accordance with a second embodiment of the present invention.

FIG. 6 is a block diagram illustrating the device for generating the AGC signal in accordance with the second embodiment of the present invention. The device is intended to improve gain control performance for all channels, by sensitively responding to a fast moving substance on a channel by shortening the repeated reset period, and by minimizing reduction of the performance of the receiver due to the increased residual jitter.

Referring to FIG. 6, an absolute value calculator 602, an integrator 400 and a buffer 606 perform the identical operations on the signal from an A/D converter 601 to FIG. 5. However, a sign-magnitude converter 608 and a square unit 609 are sequentially aligned between a frequency divider 607 and an up/down signal generator 610. The period of the repeated reset signal for resetting a buffer 605 of the integrator 400 and enabling the buffer 606 for storing an integral value is decreased to sensitively respond to the fast moving substance on the channel.

That is, since the period of the repeated reset signal is short, the frequency divider 607 removes a smaller number of low bits. Here, when the output from the frequency divider 607 is directly used to control the gain, the residual jitter is increased.

Therefore, the output from the frequency divider 607 is inputted to the sign-magnitude converter 608. The sign-magnitude converter 608 obtains a sign of the output signal from the frequency divider 607, namely the most significant bit value, and a magnitude corresponding to an absolute value of the output from the frequency divider 607.

Here, the sign is outputted directly to the up/down signal generator 610. The magnitude is squared in the square unit 609, and then outputted to the up/down signal generator 610.

The up/down signal generator 610 decides to increase or decrease the gain, namely to control the gain in a positive or negative direction on the basis of the sign. At this time, a gain control amount is decided according to the squared magnitude information in the square unit 609. That is, the up/down generator 610 generates the up/down signal by using the sign and squared magnitude information, and outputs the up/down signal to a gain converter 611.

The gain converter 611 adds the information for the currently inputted up/down signal to the information which has been used to control the gain, thereby controlling the gain of the whole system. That is, the output from the gain converter 611 is inputted to the demodulator 103 in FIG. 1 to control the gain of the analog signal inputted to the A/D converter 601.

Figure 7:
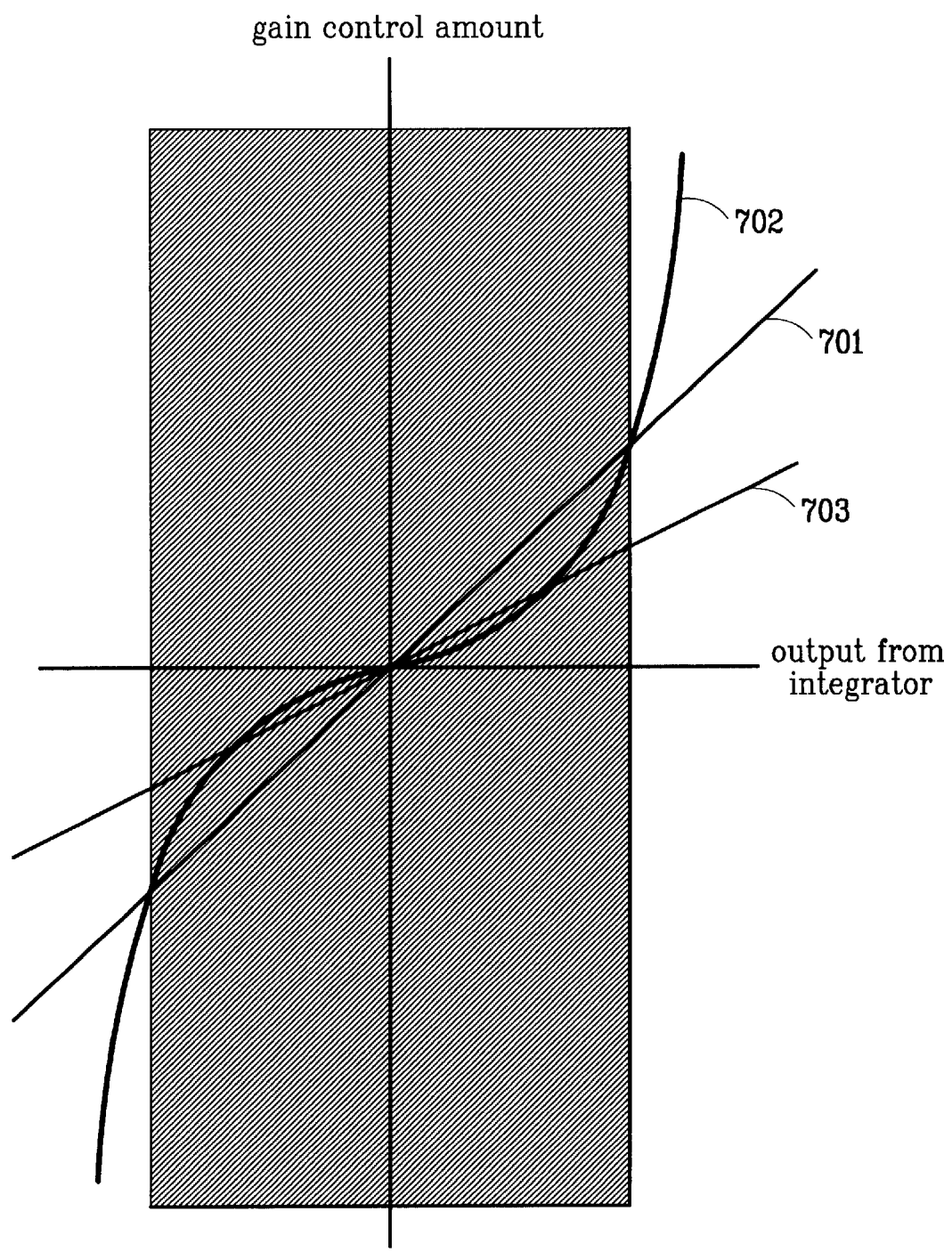
FIG. 7 shows a property curve of the device for generating the AGC signal in accordance with the present invention.

FIG. 7 shows a property of the devices for generating the AGC signal in FIG. 5 and FIG. 6 in a state where the integral period is identical.

According to the device shown in FIG. 5, the gain is controlled in proportion to the magnitude and sign of the output from the frequency divider 507 (701).

On the other hand, the device shown in FIG. 6 employs the square unit 609, and thus the gain is controlled in proportion to the square of the magnitude and sign of the output from the frequency divider 607 (702).

In a dark portion of FIG. 7, the gain control amount is smaller in the device of FIG. 6 than FIG. 5. In the other portions, the gain control amount is greater in the device of FIG. 6 than FIG. 5. A property curve (703) of FIG. 7 shows a state where the period of the repeated reset signal is increased in the device of FIG. 5.

Here, when the gain is not varied on the channel, once the gain is controlled, an additional gain control is rarely performed. That is, when controlled, the gain of the analog signal inputted to the A/D converter has a wanted average, and thus the output from the integrator is almost '0'. In this case, the residual jitter is decreased after convergence of the AGC device, by reducing the gain control.

On the other hand, when the fast moving substance exists on the channel, the gain of the input signal and the output from the integrator are remarkably influenced. Here, if the gain is less controlled to decrease the residual jitter, the device cannot sensitively respond to the channel variations, which results in reduced performance of the receiver. Therefore, in the case that serious noise varying the gain is generated on the channel, it is required to sensitively respond to the channel variations by increasing the gain control.

In the case of the property curve (703) in FIG. 7, the gain control amount is relatively small in regard to the integral value of the same magnitude. In regard to the identical output from the integrator, the gain control amount of the property curve (701) is greater than that of the property curve (703).

When the absolute value of the output from the integrator is small, the gain control amount of the property curve (702) is similar to that of the property curve (703). Conversely, when the absolute value is great, the gain control amount of the property curve (702) is greater than that of the property curve (701).

As described above, in accordance with the device for generating the AGC signal as shown in FIG. 6, when the gain variations are stable on the channel, the residual jitter is reduced after the convergence. In addition, when the gain variations are serious on the channel, the device can sensitively respond to the variations. That is, the device has advantages of the property curves (701) (703).

On the other hand, the device for generating the AGC signal as shown in FIG. 6 employs the square unit to reduce the residual jitter after the convergence. However, a high-order square unit such as a cube unit can bring the same results.

In addition, in accordance with the present invention, the demodulation is performed in an analog type. However, when the demodulation is processed in a digital type, an amplifier for the AGC must be provided in an IF band in a preceding terminal of the A/D converter. In this case, the output from the device for generating the AGC signal is inputted to the amplifier for the AGC in the IF band, not the demodulator. That is, a slice error is generated in a succeeding terminal of the A/D converter, and thus the gain control is unnecessary. Therefore, when the demodulation is performed in the analog or digital type, the gain control must be performed in the preceding terminal of the A/D converter.

As discussed earlier, in accordance with the present invention, when the gain of the input signal is very different from the wanted gain, the increase of the integral value is prevented by repeatedly resetting the integrator. Especially, the device can sensitively respond to the fast moving substance on the channel, by reducing the repeated reset period of the integrator. At the same time, it is possible to minimize reduction of the performance of the receiver due to the residual jitter generated by the shortened period. As a result, the receiver has an improved performance in regard to the gain variations of the whole channels.

What is claimed is:

1. A device for generating an auto gain control signal, comprising:

an A/D converter for converting an inputted analog signal into a digital signal;

an absolute value calculator for calculating an absolute value of the digital signal inputted from the A/D converter;

an integrator for subtracting a predetermined average from the absolute value, adding the resultant value to a preceding integral value, and being reset at predetermined intervals;

a frequency divider for calculating an average of the output from the integrator, and removing a predetermined number of low bits proportional to the integral time;

an up/down signal generator for generating an up/down signal for controlling a gain according to the output from the frequency divider; and a gain converter for storing information used to control the gain from the initial stage of the system operation, adding the information to the information of the up/down signal from the up/down signal generator, and controlling a gain of the analog signal inputted to the A/D converter.

2. The device according to claim 1, wherein the integrator comprises:
   a subtracter for subtracting a predetermined average from the absolute value;
   an adder for adding the output from the subtracter to a preceding integral value;
   a first storing unit repeatedly reset according to a repeated reset signal, for storing the output from the adder, and feeding back the stored value to the adder as the preceding integral value; and
   a second storing unit enabled according to the repeated reset signal, for storing a value from the adder just before the first storing unit is reset.

3. The device according to claim 1, wherein the up/down signal generator converts the output from the frequency divider into sign and magnitude information, decides a gain control direction according to the sign information, and decides a gain control amount according to the magnitude information.

4. The device according to claim 3, wherein the up/down signal generator decides the gain control amount by squaring the magnitude information.

5. A device for generating an auto gain control signal, comprising:
   an A/D converter for converting an inputted analog signal into a digital signal;
   an absolute value calculator for calculating an absolute value of the digital signal inputted from the A/D converter;
   an integrator for subtracting a predetermined average from the absolute value, adding the resultant value to a preceding integral value, and being reset at predetermined intervals;
   a frequency divider for calculating an average of the output from the integrator, and removing a predetermined number of low bits proportional to the integral time;
   a conversion and square unit for obtaining sign and magnitude of the signal from the frequency divider, and squaring the magnitude;
   an up/down signal generator for generating an up/down signal for controlling a gain according to the sign and squared magnitude information from the conversion and square unit; and
   a gain converter for storing information used to control the gain from the initial stage of the system operation, adding the information to the information of the up/down signal from the up/down signal generator, and controlling a gain of the analog signal inputted to the A/D converter.

6. The device according to claim 5, wherein the integrator comprises:
   a subtracter for subtracting a predetermined average from the absolute value;
   an adder for adding the output from the subtracter to a preceding integral value;
   a first storing unit repeatedly reset according to a repeated reset signal, for storing the output from the adder, and feeding back the stored value to the adder; and
   a second storing unit enabled according to the repeated reset signal, for storing a value from the adder just before the first storing unit is reset.

7. The device according to claim 5, wherein the period of the repeated reset signal inputted to the integrator is shortened.

8. The device according to claim 5, wherein the up/down signal generator decides a gain control direction according to the sign information from the conversion and square unit, and decides a gain control amount according to the squared magnitude information.

9. An integrator for a device for generating an auto gain control signal,
   a subtracter for subtracting a predetermined average from an absolute value of an inputted digital signal;
   an adder for adding the output from the subtracter to a preceding integral value;
   a first storing unit repeatedly reset according to a repeated reset signal, for storing the output from the adder, and feeding back the stored value to the adder as the preceding integral value; and
   a second storing unit enabled according to the repeated reset signal, for storing a value from the adder just before the first storing unit is reset.

10. A method for generating an auto gain control signal, comprising the steps of:
   (a) converting an inputted analog signal into a digital signal;
   (b) calculating an absolute value of the output of step (a), subtracting a predetermined average from the absolute value, and adding the resultant value to a preceding integral value after resetting a buffer;
   (c) removing a predetermined number of low bits proportional to an integral time;
   (d) generating an up/down signal for controlling a gain according to the output of step (c); and
   (e) storing information used to control the gain from the initial stage of the system operation, adding the information to the information of the up/down signal from step (d), and controlling a gain of the analog signal inputted to step (a).

11. The method according to claim 10, wherein step (b) comprises the steps of:
   calculating an absolute value of the inputted digital signal;
   subtracting a predetermined average from the absolute value;
   adding the output from the subtracting step to a preceding integral value;
   repeatedly resetting according to a repeated reset signal, storing the output of the adding step, and feeding back the stored value to the adding step as the preceding integral value; and
   enabling according to the repeated reset signal, and storing a value from the adding step just before the storing step is reset.

12. The method according to claim 10, wherein the period of the repeated reset signal inputted to step (b) is shortened.

13. The method according to claim 10, wherein step (d) converts the output of step (c) into sign and magnitude information, decides a gain control direction according to the sign information, and decides a gain control amount according to the magnitude information.

14. The method according to claim 13, wherein step (d) decides the gain control amount by squaring the magnitude information.

* * * * *